United States Patent
Hauer et al.

(10) Patent No.: US 8,054,089 B2
(45) Date of Patent: Nov. 8, 2011

(54) CAPACITANCE MEASURING CIRCUIT

(75) Inventors: Johann Hauer, Erlangen (DE); Stefan Moedl, Hilpoltstein (DE); Marcus Hartmann, Hilpoltstein (DE)

(73) Assignee: Fraunhofer-Gesellschaft zur Foerderung der angewandten Forschung e.v., Munich (DE)

( * ) Notice: Subject to any disclaimer, the term of this patent is extended or adjusted under 35 U.S.C. 154(b) by 327 days.

(21) Appl. No.: 11/915,183

(22) PCT Filed: May 24, 2006

(86) PCT No.: PCT/EP2006/004989
§ 371 (c)(1),
(2), (4) Date: Dec. 20, 2007

(87) PCT Pub. No.: WO2006/125639
PCT Pub. Date: Nov. 30, 2006

(65) Prior Publication Data
US 2008/0191713 A1    Aug. 14, 2008

(30) Foreign Application Priority Data

May 25, 2005    (DE) .......................... 10 2005 024 098
Aug. 17, 2005    (DE) .......................... 10 2005 038 875

(51) Int. Cl.
*G01R 31/08* (2006.01)
*H03M 3/00* (2006.01)

(52) U.S. Cl. .......................... 324/658; 324/519; 341/143

(58) Field of Classification Search .................. 324/519, 324/658–690; 341/143
See application file for complete search history.

(56) References Cited

U.S. PATENT DOCUMENTS

| | | | |
|---|---|---|---|
| 3,886,447 A * | 5/1975 | Tanaka | 324/678 |
| 5,166,630 A * | 11/1992 | Lee | 327/554 |
| 5,659,254 A | 8/1997 | Matsumoto et al. | |
| 5,699,005 A * | 12/1997 | Menkhoff et al. | 327/292 |
| 6,140,952 A | 10/2000 | Gaboury | |
| 6,300,776 B1 * | 10/2001 | Schreiber et al. | 324/607 |
| 6,362,761 B1 * | 3/2002 | Bonardi et al. | 341/143 |

(Continued)

FOREIGN PATENT DOCUMENTS

| | | |
|---|---|---|
| JP | 10-084255 A | 3/1998 |
| JP | 2005-517945 A | 6/2005 |
| WO | 03/071230 A2 | 8/2003 |
| WO | 2004/090570 A2 | 10/2004 |
| WO | 2006/011975 A1 | 2/2006 |

OTHER PUBLICATIONS

English translation of the official communication issued in counterpart International Application No. PCT/EP2006/004989, mailed on May 15, 2008.

(Continued)

*Primary Examiner* — Jeff Natalini
*Assistant Examiner* — Farhana Hoque
(74) *Attorney, Agent, or Firm* — Keating & Bennett, LLP

(57) ABSTRACT

The present invention is based on the finding that a capacitance can be measured precisely and efficiently when, in a delta-sigma modulator having an operational amplifier, a first capacitor connectable to an input of the operational amplifier, and a second capacitor in a feedback branch of the operational amplifier, a reference signal source is connectable to the first capacitor, wherein the first or second capacitor may represent a capacitance to be measured. Due to the fact that, in contrast to what is conventional, no input quantity is measured and digitalized at the input of the delta-sigma modulator, but instead a defined reference signal source is coupled at the input and a device of the delta-sigma modulator itself represents the measuring quantity, an extremely compact circuit is provided allowing capacitances to be measured quickly and reliably, the measuring result being additionally made available in a digital form.

6 Claims, 8 Drawing Sheets

U.S. PATENT DOCUMENTS

| | | |
|---|---|---|
| 6,452,521 B1 | 9/2002 | Wang et al. |
| 6,720,777 B2 | 4/2004 | Wang |
| 6,744,394 B2 * | 6/2004 | Liu et al. ................ 341/155 |
| 7,145,350 B2 | 12/2006 | Mellert et al. |
| 2003/0155936 A1 | 8/2003 | Wang |
| 2004/0008041 A1 | 1/2004 | Davis et al. |
| 2006/0279321 A1 | 12/2006 | Ruppender et al. |
| 2007/0035314 A1 | 2/2007 | Suntken |

OTHER PUBLICATIONS

Official communication issued in the International Application No. PCT/EP2006/004989, mailed on Aug. 14, 2006.

Official communication issued in the counterpart International Application No. PCT/EP2006/004989, mailed on Aug. 14, 2006.

* cited by examiner

CAPACITANCE MEASURING CIRCUIT

TECHNICAL FIELD

The present invention relates to measuring capacitances and, in particular, to a concept for precisely measuring a capacitance and providing the measuring result as a digital bit stream.

BACKGROUND

Capacitive sensors are employed to a wide extent in measuring technology and sensorics. Exemplarily, distances between two measuring points can be determined when precisely measuring the capacitance between the two measuring points so that when knowing the theoretical context between capacitance and distance, the distance between the two measuring points can be deduced using the capacitance measured. In general, the capacitance between two surfaces is determined by the surface geometry and a dielectric surrounding the surfaces. If the characteristics of the dielectric are changed by bringing a material having different dielectric characteristics close to the surfaces, the capacitance between the two surfaces sometimes varies considerably.

Many technological applications make use of this by utilizing a variation in capacitance to prove contacting of an object or a surface. This is, for example, the case when driving special touch-sensitive displays. In particular, touching the frame of a car window by a part of the human body can be proved by means of capacitive measurements, wherein the capacitance between two wires integrated into the sealing rubber or the capacitance between a single wire and the metallic window frame is exemplarily determined. This allows implementing a reliable protection against getting trapped which prevents an electric window lift from closing the car window when a part of the body touches the sealing area or is close thereto so that serious injuries are avoided. The capacitive measurement here has the great advantage that, compared to conventional methods which are based on an increase in the motor current when the window hits an obstacle, it is considerably securer since no mechanical contact between the window and the part of the body is necessary for the method to work. With mechanical contact, a comparatively small force causing a small variation in current below the regulating threshold may eventually already cause injuries, like for example in a child's hand. Electric motor tracking may also result in trapped parts of the body being injured although the trapping in principle has been recognized. The problems mentioned above are in principle prevented by the capacitive measurement.

A number of measuring methods are known to allow precise measurements of small variations in capacitance.

Exemplarily, detunable oscillators (excited RCL circuits) where the resonant frequency is influenced by a varying capacitance are used. Thus, the voltage across an ohmic resistor R which with a fixed resistance R and a fixed inductance L is proportional to the capacitance, is usually determined as measuring quantity. Normally, the voltage measured then has to be digitalized to calculate the capacitance from the proportionality relation.

Furthermore, charge transfer methods where a first capacitance is charged in a first phase and the charge is transformed to a second capacitance in a second phase are conventional methods. Here, both the first and the second capacitances may be used as measuring capacitance. The quantity of the measuring capacitance must be known in order to be able to determine the capacitance of the capacitor to be measured. Usually, the voltage across the measuring capacitance is determined as measuring quantity.

Bridge circuits where the capacitance to be measured is determined by a time-consuming tuning method in which usually a diagonal voltage of the bridge circuit is regulated to be zero are frequently used for measuring capacitances.

Additionally, synchronous demodulator methods may be employed for measuring capacitances.

Since the analog measuring signals are typically digitalized for further signal processing, often the problem arises that the output voltage range provided by the analog sensor (such as, for example, a capacitance) does not match the dynamic input range of a downstream analog-to-digital converter stage, resulting in a decrease in precision in the digital measuring result.

U.S. Pat. No. 6,452,521 B1 describes a concept of how the dynamic range of an analog measuring signal at the output of a sensor can be mapped or adjusted to the dynamic input range of a delta-sigma modulator. In order to achieve this, a mapping circuit is coupled to the integrator of a delta-sigma modulator to adjusting the analog input range of the integrator to the analog output range of the sensor. Thus, the integrator provides an integrated output signal to a controller which produces a digital output signal, the digital output signal being in a digital range of values representing the potential range of values of the analog input signal.

Capacitance measuring methods used so far are based on analog circuits the measuring signals of which must be processed using complicated analog signal processing or be transmitted in an analog manner to an analog-to-digital converter in order to allow subsequent digital processing. The great number of electrical devices necessary for such an implementation is, on the one hand, of disadvantage concerning the cost caused. On the other hand, the result is increased space requirements in the implementation, which is also of disadvantage when only little space is available, like for example when installing capacitance measuring circuits in a vehicle.

The temporal behavior of the measuring circuit additionally has an important role in monitoring tasks. Detunable oscillators, for example, first have to settle at a new frequency before a reliable measurement may take place, wherein the subsequent analog-to-digital conversion necessitates additional time so that a reliable measuring result will only result after a long measuring period.

SUMMARY

According to an embodiment, a capacitance measuring circuit operated in a clocked manner may have: a delta-sigma modulator in differential structure having an operational amplifier having differential outputs, and a first capacitor connected in a first clock with a first terminal to the inverting input and with a second terminal to the non-inverting input of the operational amplifier; and a first reference signal source connected in a second clock to the first terminal of the first capacitor and a second reference signal source connected in the second clock to the second terminal of the first capacitor; wherein the first capacitor represents a capacitance to be measured.

An embodiment of the present invention is based on the finding that a capacitance can be measured precisely and efficiently when, in a delta-sigma modulator comprising an operational amplifier, a first capacitor connectable to an input of the operational amplifier and a second capacitor in a feedback branch of the operational amplifier, a reference signal source is connectable to the first capacitor, the first or second capacitor representing a capacitance to be measured.

Due to the fact that, in contrast to conventional art, no input quantity has to be measured and digitalized at the input of the delta-sigma modulator, but that instead a defined reference signal source is coupled at the input and an element of the delta-sigma modulator itself represents the measuring quantity, the result is an extremely compact circuit providing a way of fast and reliable measurements of capacitances.

Using a compact integrated circuit, an inventive capacitance measuring circuit allows measuring a capacitance with high precision, wherein only very little expenditure for devices is necessary here.

Another great advantage of an embodiment of the present invention is that the measuring result is directly in a digital form so that additional digitalization and additional expenditure for circuits connected thereto can be avoided.

A synchronously operated delta-sigma converter can be operated at high a clock frequency so that a measuring result is available extremely quickly. In addition, the digital bit stream which is provided directly by the delta-sigma converter can be processed easily by downstream signal processing so that the measuring precision can be increased further in an uncomplicated manner, like for example by averaging.

In an embodiment of the present invention, a delta-sigma modulator is implemented in switched capacitance technology. This means that the currents necessary for integrating a signal are applied to the input of the integrator in a discrete-time manner, the currents being produced by discharging capacitors. At the same time, the charges on the capacitor in the input branch and the balance charge which, depending on the current state of the delta-sigma modulator, may have a positive or negative sign, are transferred to the integration capacitance of an integrator. The analog voltage U forming at the output of the integrator will be proportional to the ratio of the capacitances of the input capacitor $C_{in}$ and the feedback capacitor $C_{feedback}$ ($U \sim C_{in}/C_{feedback}$).

The number of clocks necessary until switching the direction of integration determines the resolution of the digitalized output signals so that the resolution can advantageously be adjusted within broad limits by the ratio of the input capacitance and the feedback capacitance, to achieve a quantization allowing a desired precision of the measuring result.

Since the readout result depends on the ratio of the input capacitance and the feedback capacitance, the capacitance to be measured may be both the capacitance in the input branch and the feedback capacitance, wherein that capacitance for which coupling of the measuring sensor can be realized easier as far as circuit-technology is concerned may be used as measuring quantity.

In another embodiment of the present invention, an offset capacitance which is at the same time connectable with the input of the integrator to the input capacitance and can be charged by means of an offset voltage is used in addition to the input capacitance. Thus, the offset voltage has the same magnitude as the reference voltage of the input capacitance, however the two voltages have different signs. By adding the charges of the two capacitances, it becomes possible to subtract a charge offset from a charge to be integrated, which is equivalent to subtracting a static portion from the capacitance to be measured. This may be of particular advantage when the capacitance to be measured has a static and a dynamic portion, wherein the static portion is of no interest so that it can be suppressed by applying an offset capacitance which roughly corresponds to the static capacitance of the measuring capacitance.

For the inventive concept for measuring capacitances, the measuring precision achievable is mainly dependent on steadily producing two reference voltages inverse to each other and is not based on exactly sticking to parameters of passive devices, such as, for example, capacitances and inductances. Two complementary voltages can be made available easily using well-known circuit principles, wherein equality of the absolute magnitudes of the two voltages can be ensured, thereby resulting in high measuring precision of the inventive capacitance circuit since it is largely independent of the strongly scattering parameters of discrete devices.

In an embodiment of the present invention, a differential operational amplifier which is wired in a completed balanced manner is used. The differential operational amplifier has a first and a second feedback branch of identical feedback capacitances. The capacitance to be measured here is connectable between the inverting and the non-inverting input of the differential operational amplifier. The two signals applied to the differential outputs of the differential operational amplifier are added for further processing so that all in all increased sensitivity of the inventive capacitance measuring circuit will result. Another great advantage of the differential wiring is that potential interference signals which may, for example, be impressed by the induction of the capacitance circuit, are amplified by the differential operational amplifier with different signs so that the subsequent addition suppresses the interfering signal influences. This is, for example, of advantage in technological applications when the capacitance is generated by two long wires guided in the rubber sealing of a car door. They may have the effect of an antenna and thus cause undesired additional current flows which, however, are compensated by the differential implementation of an embodiment of the present invention.

BRIEF DESCRIPTION OF THE DRAWINGS

Embodiments of the present invention will be detailed subsequently referring to the appended drawings, in which:

FIG. 2b shows a timing diagram for switching the measuring capacitance of FIG. 2a;

FIG. 7b shows signal forms of the delta-sigma modulator of FIG. 7a;

DETAILED DESCRIPTION

Since delta-sigma modulators are frequently used for the analog-to-digital conversion of measuring signals and the mode of functioning thereof is necessary for understanding the idea on which the invention is based, the mode of functioning of typical implementations of delta-sigma modulators will be discussed briefly below referring to FIGS. 7a, 7b, 8 and 9.

Figure 7A:
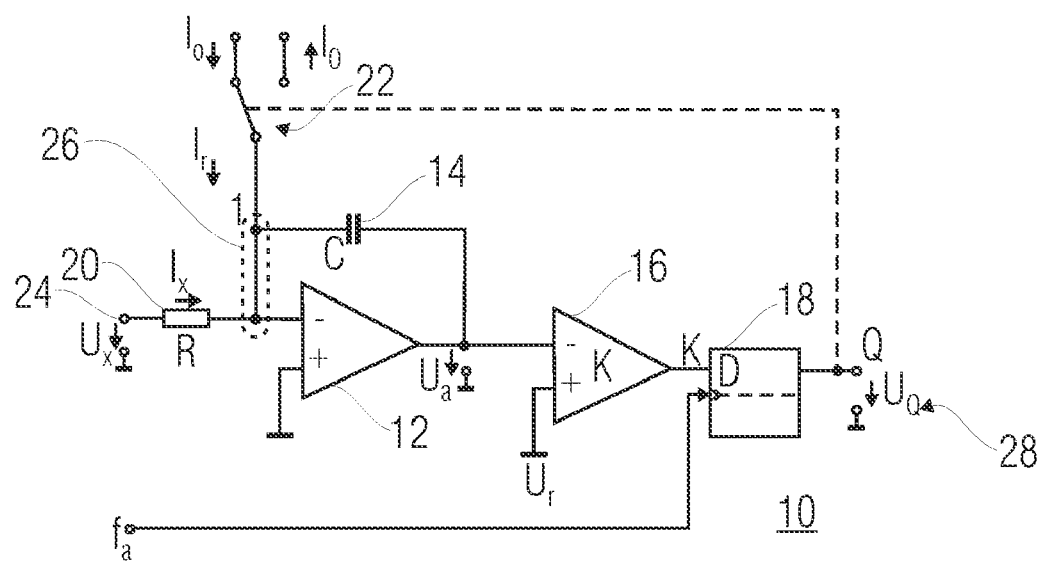
FIG. 7a shows a circuit diagram of a delta-sigma modulator.
Figure 7B:
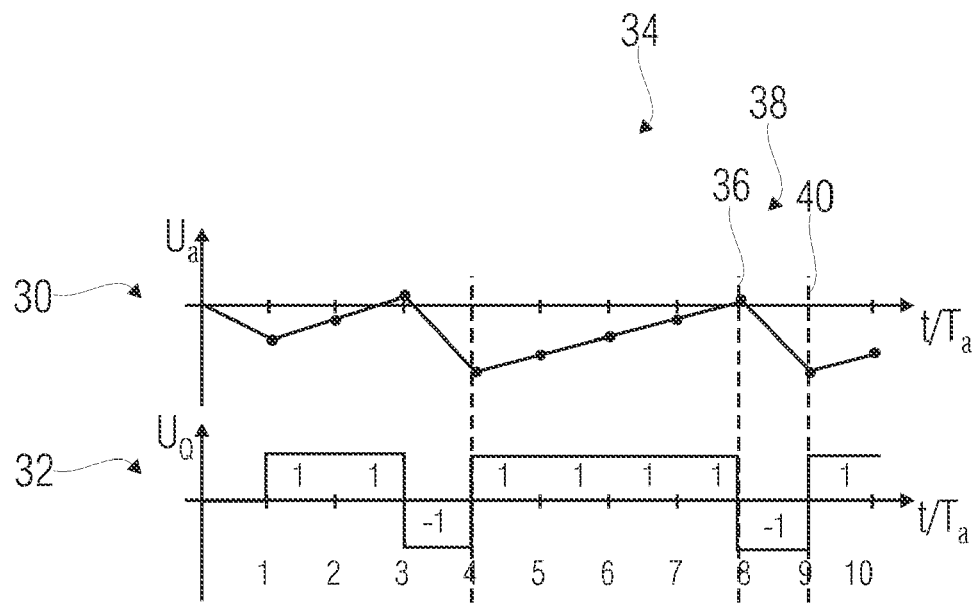

FIGS. 7a and 7b show a delta-sigma modulator making available at its output a clocked digital signal which is based on continuous input quantities. The delta-sigma modulator or converter 10 shown in FIG. 7a comprises an operational amplifier 12 having a capacitance 14 in the feedback branch, a comparator 16, a D flip-flop 18 clocked by the sample frequency $f_a$, an input resistor 20 and a switch 22.

The input resistor 20 is connected between the voltage 24 ($U_x$) to be digitalized and the circuit node 26. The circuit node 26 is connected to the inverting input of the operational amplifier so that the capacitance 14 in the feedback branch of the operational amplifier 12 is connected between the output of the operational amplifier 12 and the circuit node 26. The circuit node 26 is additionally connected to a switch 22 which either connects the circuit node to a current source providing a positive balance current $I_r$ of the magnitude $I_0$ or which connects the circuit node 26 to a current source providing a negative balance current $I_r$ of the magnitude $I_0$. The non-inverting input of the operational amplifier 12 is connected to ground, wherein the output of the operational amplifier 12 is connected to the inverting input of the comparator 16 the non-inverting input of which is at a reference voltage ($U_r$). The output of the comparator 16 is connected to an input of the clocked D flip-flop 18, wherein the output of the clocked D flip-flop 18 makes available normalized voltage pulses 28 representing a digital bit stream. The output of the D flip-flop 18 is additionally connected to the switch 22 to control the switching state of the switch 22.

The mode of functioning of the delta-sigma modulator is to be discussed subsequently making reference to the signal forms of FIG. 7b. The voltage 24 to be digitalized generates, across the input resistor 20, a current $i_x$ which adds to the balance current $I_r$ at the circuit node 26 so that the sum of the current $i_x+I_r$ is integrated by the capacitor 14. The balance current $I_r$ here has the same magnitude as $I_0$, however, the direction of the current flow can be varied by means of the switch 22. In the top graph 30 of FIG. 7b, the voltage $U_a$ at the output of the operational amplifier is illustrated as a function of time in units of a clock time $T_a$ which is used for driving the D flip-flop. The bottom graph 32 shows the voltage 28 forming at the output of the D flip-flop 18, also as a function of time. During a first phase 34 in which the current flow directions of $i_x$ and $I_r$ are mutually opposite, the voltage at, among other things, the output of the operational amplifier 12 increases slowly since the net current $I_N$ flowing to the capacitor 14 is smaller than $i_x$ ($I_n=i_x-I_0$). If the voltage $U_a$ exceeds the reference voltage of the comparator 16 at the time 36, the voltage applied to the output of the comparator 16 will change and the D flip-flop 18 will change its output voltage representing a logic state of 1 to an inverse output voltage (−1). Since, according to FIG. 7a, the switch 22 is controlled by the output voltage 28 of the D flip-flop 18, the current flow direction of the current $I_r$ also changes at the time 36 so that from the time 36 on a net current $I_N=i_x+I_0$ is integrated by the capacitor 14 so that the voltage $U_a$ decreases rapidly during a phase 38. In the example shown here, the voltage at the capacitor 14 decreases with such a speed that already at a time 40, i.e. one clock after varying the current flow direction, the voltage $U_a$ at the input of the comparator 16 has decreased below the reference voltage $U_r$. Thus, the comparator 16 and the D flip-flop 18 change their output signals at the time 40 (from −1 to 1) and another period of time of a continuously increasing voltage $U_a$ begins.

The speed by which the voltage $U_a$ at the output of the operational amplifier 12 decreases and/or increases, is dependent on the sum of a current $I_R$ provided with a sign and a current $i_x$ depending on the measuring quantity. Thus, the number of clocks having a length $T_a$ necessary in the respective current flow direction until reaching the switching threshold of the comparator is dependent on the current $i_x$, i.e. on the voltage $U_x$ to be measured. The form of the voltage 28 at the output of the D flip-flop 18, i.e. the digital bit sequence representing this voltage, thus contains information on the quantity of the measuring signal 24, so that the quantity of the voltage 24 to be measured can be determined easily by means of digital signal processing at the output of the D flip-flop 18.

A principle of charge balance conversion is implemented in the delta-sigma transformer of FIG. 7a by means of a D flip-flop described by a fixed clock. Thus, the analog input quantities are continuous, which means that they are not fed to the integrator in a clocked manner.

Figure 8:
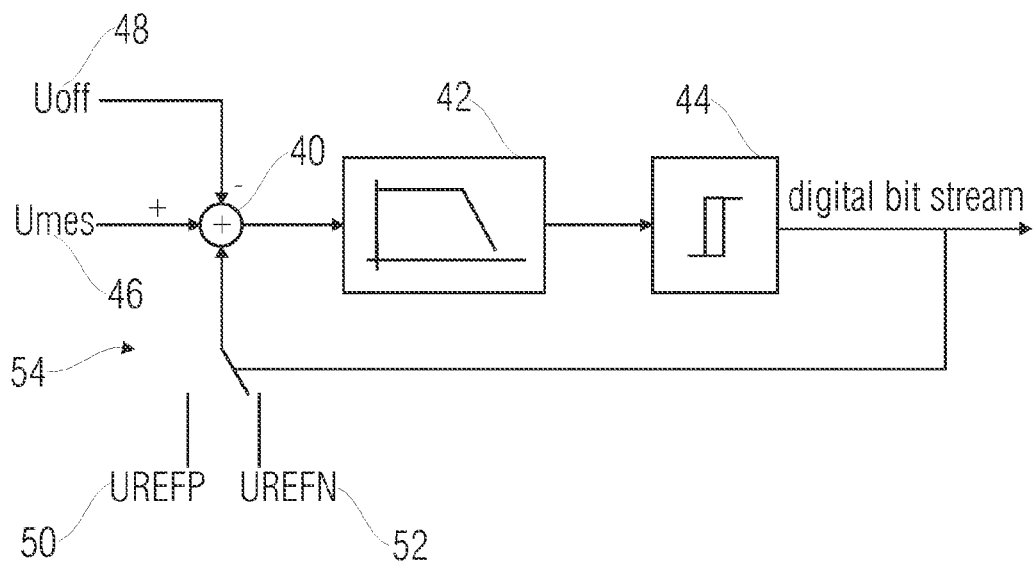
FIG. 8 shows a basic circuit diagram for the mode of operation of a delta-sigma modulator.

FIG. 8 shows the basic mode of functioning of the delta-sigma modulation method using the example of a voltage to be measured which may additionally be provided with an offset voltage for adjusting the dynamic range.

Adding means 40, integrating means 42 and triggering means 44 are illustrated. The adding means 40 is connected to the voltage 46 to be measured, an offset voltage 48 and optionally a positive reference voltage 50 or a negative reference voltage 52. A switch 54 controls whether the adding means 40 is connected to the positive reference voltage 50 or the negative reference voltage 52.

The triggering means 44 controls the switching performance of the switch 54 so that alternatingly adding and subtracting a fixed reference signal to the measuring signal, which is essential for the delta-sigma conversion method, is made possible. It is to be noted that in FIG. 8 additionally a way of permanently adding an offset voltage 48 to the measuring voltage 46 is provided, whereby a direct voltage portion not of interest may, for example, be subtracted from the voltage 46 to be measured.

Figure 9:
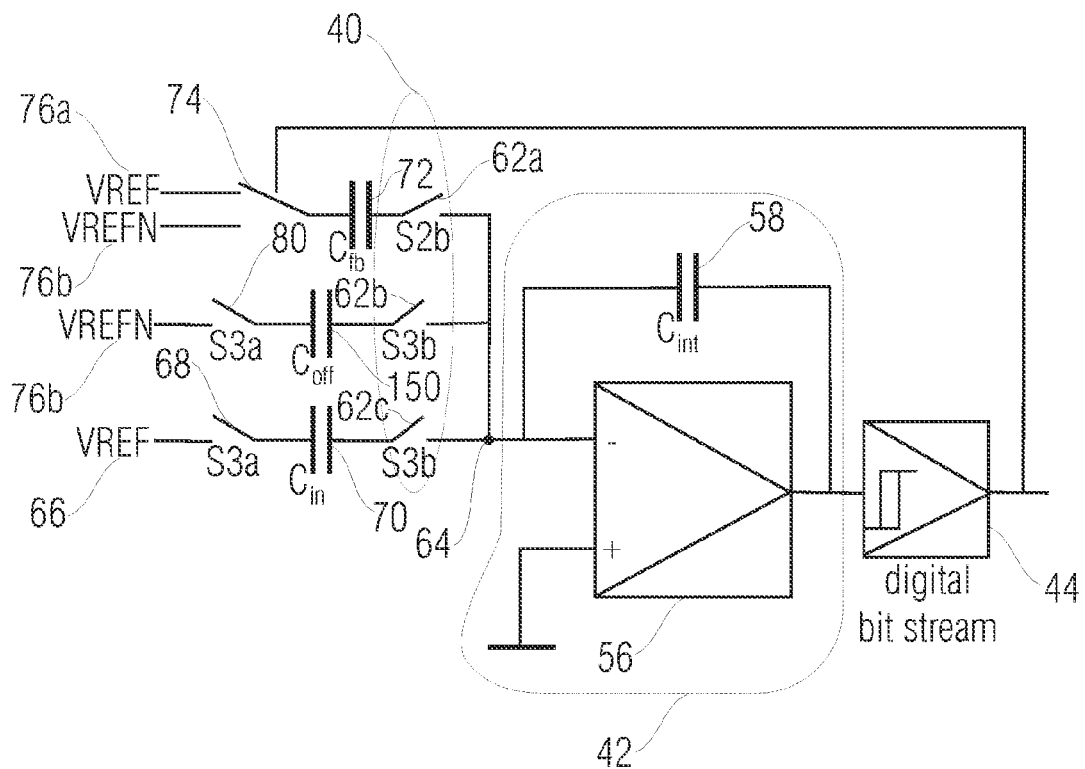
FIG. 9 shows a delta-sigma modulator in switched capacitance technology.

FIG. 9 shows a variation of a delta-sigma modulator, FIG. 9 representing an embodiment of the principle shown in FIG. 8, so that the same functional units may be identified which are also provided with same reference numerals. FIG. 9 shows triggering means 44, integrating means 42 including an operational amplifier 56 and a feedback capacitance 58, and adding means 40 comprising three switches 62a to 62c.

Since the mode of functioning of the triggering means 44 and the integrating means 42 corresponds to the mode of functioning of the examples discussed making reference to FIGS. 7a and 8, this will not be discussed subsequently in greater detail, only aspects differing from FIGS. 7a, 7b and 8 shall be discussed.

In FIG. 9 the input quantities to be measured and/or the balance and offset quantities necessary are not applied to the input of the integrator in a continuous, but clocked manner and controlled by an external clock. A circuit node 64 is connected to the inverting input of the operational amplifier 56 in a conducting manner. An input voltage 66 to be measured is connectable to a first terminal of an input capacitance 70 via a switch 68, wherein a second terminal of the input capacitance 70 can be connected to the circuit node 64 via the switch 62c.

In order to make the charge balance principle possible, a first terminal of a balance capacitor 72 is connectable to either a positive reference voltage 76a or a negative reference voltage 76b via a switch 74. A second output of the balance capacitor 72 is connectable to the circuit node 64 via the switch 62a. An offset capacitor 78 can be connected, with a first terminal, to the negative reference voltage 76b via a switch 80, wherein a second terminal of the offset capacitor 78 can be connected to the circuit node 64 via the switch 62b.

The principle of charge balance conversion as has already been discussed referring to FIGS. 7a and 8 remains unchanged, however, the charge and/or a current is no longer fed to the integrating means 42 in a continuous, but clocked manner. The clocking is performed by synchronously driving the switches 62a to 62c and the switches 68, 74 and 80. At first, a charge is applied to the capacitors 70, 72 and 78 by opening the switches 62a to 62c and by closing the switches 68, 74 and 80. The charge on the input capacitor 70 here describes the voltage 66 to be measured (since Q~C), the offset charge applied to the capacitor 78 allows subtracting an offset, and the charge applied to the balance capacitor 72 is the balance charge for converting the charge balance method. The balance charge applied to the balance capacitor 72 still has the same absolute magnitude, but a different sign, depending on whether the balance capacitor 72 is connected to the positive reference voltage 76a or the negative reference voltage 76b.

In the second step, the switches 68, 74 and 80 are opened and the switches 62a to 62c are closed so that the charges accumulated on the capacitors 70, 72 and 78 are transferred via the circuit node 64 onto the feedback capacitor 58, wherein simultaneously closing the switches causes the charges of the capacitors 70, 72 and 78 to be added.

By repeating the above steps several times, a bit stream the bit pattern of which carries the information on the quantity of the input voltage to be measured is generated at the output of the triggering means 44. Thus, the sample frequency, i.e. the frequency at which the individual bits of the bit stream are generated, is dependent on the fixed operating frequency of the delta-sigma modulator.

Subsequently, the present invention will be discussed making reference to embodiments which are based on the principle of analog-to-digital conversion by means of delta-sigma modulators, wherein identical functional elements in the figures are provided with same reference numerals. Thus, figures to be taken as extensions of embodiments already discussed will only be discussed with regard to the new aspects added. The principle of delta-sigma modulators has been discussed referring to FIGS. 7a, 7b, 8 and 9, which is why a repeated discussion of this principle will be omitted.

Figure 1:
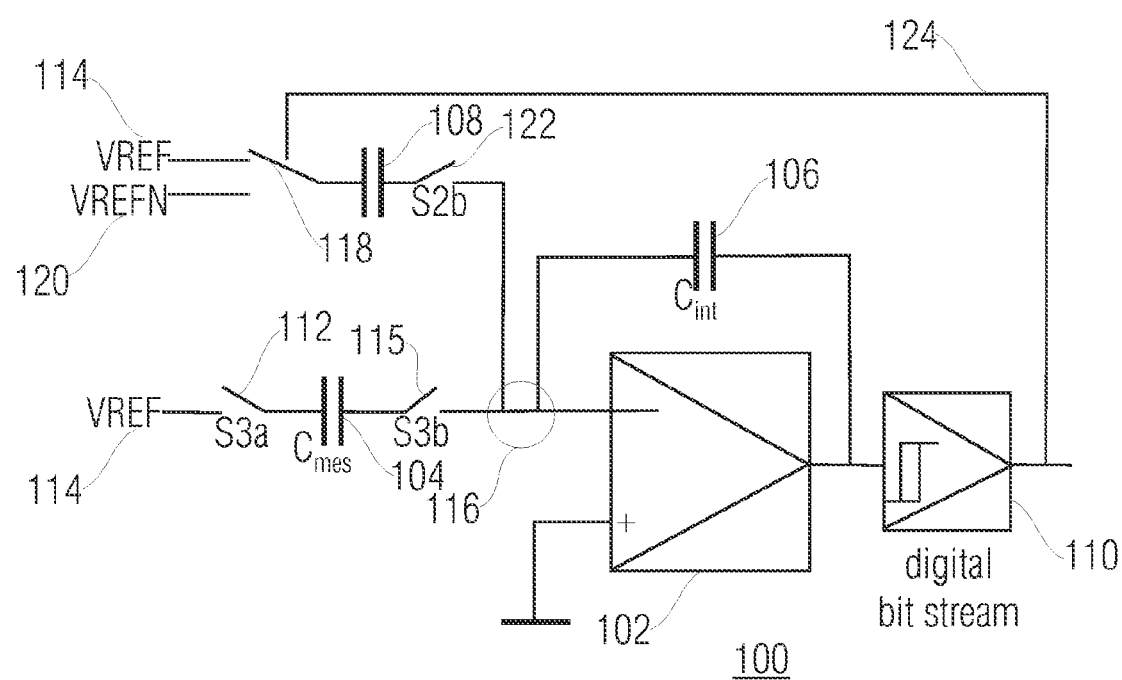
FIG. 1 shows an inventive capacitance measuring circuit.

FIG. 1 shows an inventive capacitance measuring circuit 100. An operational amplifier 102, a measuring capacitor 104, an integration capacitor 106, a balance charge capacitor 108 and triggering means 110 are illustrated. The operational amplifier 102 and the integration capacitor 106 together form an integrator integrating the charge applied to the inverting input of the operational amplifier 102 and/or the current flowing there onto the integration capacitance 106.

A first terminal of the measuring capacitor 104 is connectable to a positive reference voltage 114 via a switch 112, a second terminal of the measuring capacitor 104 is connectable to a circuit node 116 via a switch 115, the circuit node 116 being connected to the inverting input of the operational amplifier 102 in a conducting manner. The non-inverting input of the operational amplifier 102 is grounded and the integration capacitor 106 is in the feedback branch of the operational amplifier 102 and is thus connected between the circuit node 116 and the output of the operational amplifier 102. The output of the operational amplifier 102 is also connected to an input of the triggering means 110. A first terminal of the balance charge capacitor 108 can be connected to the positive reference voltage 114 or a negative reference voltage 120 via a switch 118 and a second terminal of the balance charge capacitor 108 can be connected to the circuit node 116 via a switch 122. The switch position of the switch 118 is controlled by the output signal of the triggering means 110, which is why it is connected to the switch 118 via a control connection 124.

In the embodiment of the present invention shown in FIG. 1, the capacitance to be determined is disposed in the input branch of the operational amplifier, which means that the variable capacitance to be measured is the measuring capacitance 104. The delta-sigma modulation principle can be achieved by a clocked operation of the capacitance measuring circuit 100 by driving the switches 115 and 122 together and by also driving together the switches 112 and 118, wherein driving is performed at a non-overlapping two-phase clock of constant frequency, as will be discussed below referring to FIGS. 2a and 2b.

As has been discussed referring to FIGS. 8 and 9, in a conventional delta-sigma modulator, the capacitance Cmes at the input of the modulator is charged from the input voltage to be measured in the first clock phase. In the second clock phase, the charge is placed on the integration capacitance Cint and processed according to the well-known delta-sigma principles.

The present invention describes a system in which the input voltage Uin is replaced by a fixed reference voltage and additionally the capacitances in the input branch or in the feedback branch are replaced by the measuring capacitance.

The measuring capacitance 104 is coupled to the input of a delta-sigma modulator. The modulator operates at a fixed operating frequency. The measuring capacitance 104 (Cmes) is charged step by step via the switch 112 from a defined voltage 114 (VREF). Subsequently, the charge is placed onto the integration capacitance (106) of the integrator via the switch 115, integrated and evaluated. The switches 112, 115, 122 and 118 are operated at a non-overlapping two-phase clock of fixed frequency. The output bit current output by the triggering means 110 is integrated and/or fed to a digital filter. The measuring range of the modulator is determined by the ratio of the capacitances in the feedback branch (126) and the input branch (124). If additionally a defined charge is subtracted from the integration charge, a fixed offset portion can be subtracted from the measuring capacitance, as will be discussed below referring to FIG. 3.

Figure 2A:
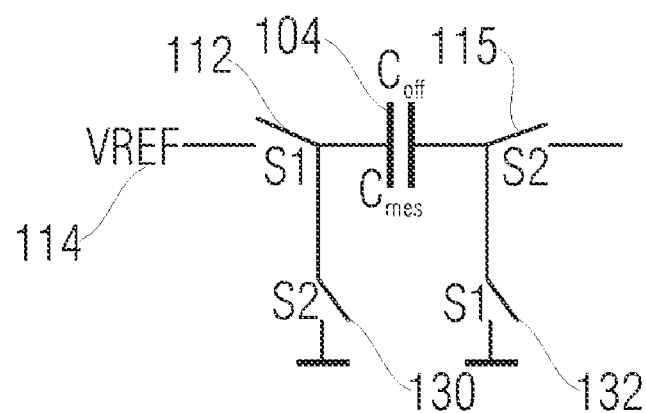
FIG. 2a shows alternative ways of switching a measuring capacitance.

FIG. 2a shows the measuring capacitance 104 of the inventive capacitance measuring circuit which, as can also be seen in FIG. 1, is connectable to the positive reference voltage 114 via the switch 112. In FIG. 2a, additionally an alternative way of switching the measuring capacitance 104 by means of two switches 130 and 132 is illustrated, wherein the measuring capacitance 104 can be closed towards ground by means of the switch 130 on the side of the reference voltage, and wherein the measuring capacitance 104 can also be switched towards ground by means of the switch 132 on the side of the circuit node 116. It is to be noted here that both circuit variations are equivalent regarding the result achieved when operated by a timing illustrated in FIG. 2b.

Figure 2B:
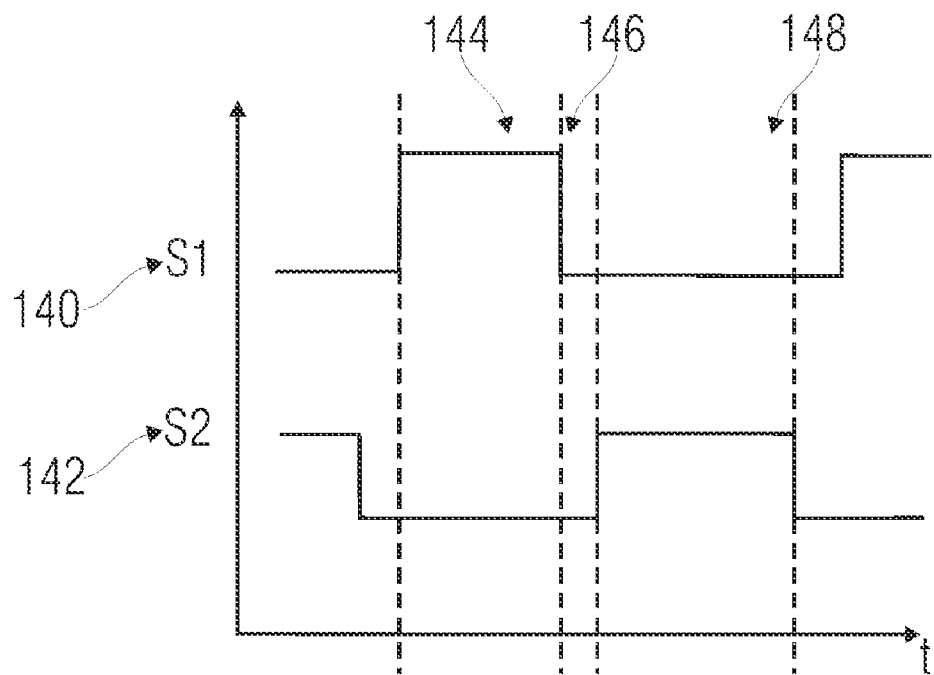

FIG. 2b shows a non-overlapping two-phase clock of constant frequency suitable for operating the inventive capacitance measuring circuit and/or for controlling the switches in FIG. 2a. The switch 112 and the switch 132 are driven by the first clock signal 140 (S1), whereas the switch 115 and the switch 130 are driven by the second clock signal 132 (S2). As can be seen in FIG. 2b, during a phase 144 in which the switch 112 or 132 is closed and the capacitor is charged by means of the reference voltage 114, the switches 115 and 130 are opened, so that the charge cannot drain off towards the operational amplifier.

In a phase 146, both the control signal 140 and the control signal 142 are low, which means that all switches (112, 115, 130 and 132) are opened so that the charge remains on the measuring capacitance 104. In a third phase 148, the switch 115 and/or the switch 130 are finally closed so that the charge on the measuring capacitance 104 can drain off towards the integration capacitance.

Thus, it should be kept in mind that it is essential for the driving signals 140 and 142 not to overlap to be able to transfer the full charge stored on the measuring capacitor 104 onto the integration capacitance.

Figure 3:
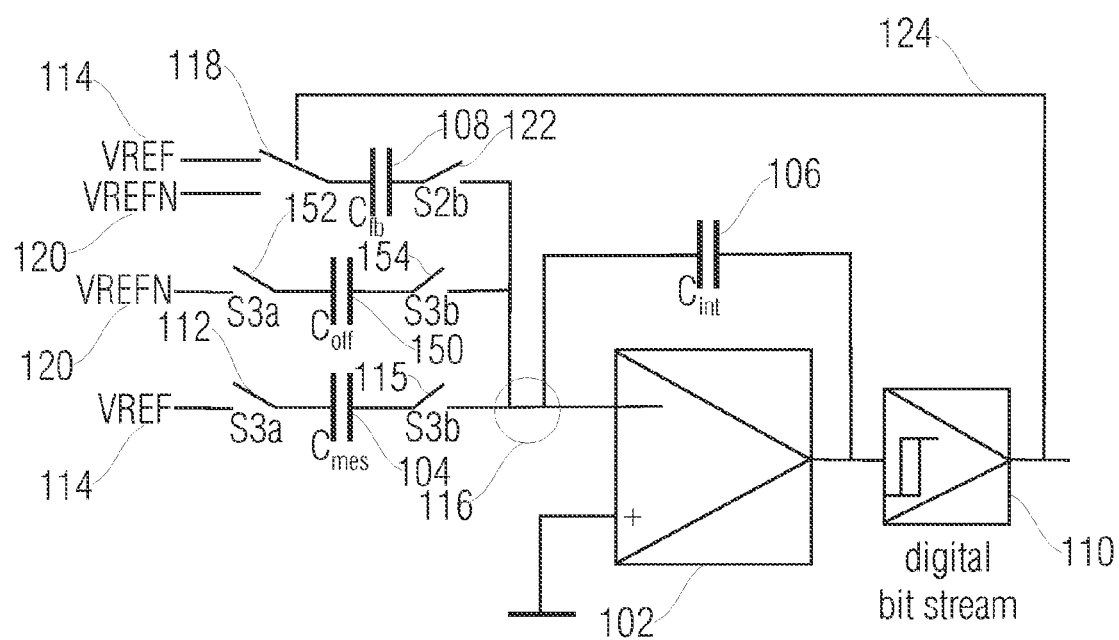
FIG. 3 shows a capacitance measuring circuit additionally offering a way of subtracting an offset.

FIG. 3 shows an embodiment of the present invention which is an extension of the embodiment discussed in FIG. 1, wherein additionally a way of subtracting an offset capacitance and/or an offset signal from the capacitance to be measured is provided.

An offset capacitance 150 is, with a first terminal, connectable to the negative reference voltage 120 via a switch 152. In addition, the offset capacitance 150 is, with a second terminal, connectable to the circuit node 116 via a switch 154. According to the invention, the charge Qoff on the offset capacitance 150 is transferred together with the charges Qmeas on the measuring capacitance 104 and the charges Ofb on the balance capacitance 108 onto the integration capacitor 106 in a clocked manner. Thus, the following applies for the charge Qint transferred per step:

$$Q\text{int} = Q\text{meas} - (Q\text{off} + O\text{fb})$$

Thus, the charge of the measuring capacitance 104, the offset capacitance 150 and the balance charge capacitor 108 are applied simultaneously onto the integration capacitance 106, wherein for the wiring as shown in FIG. 3, the following conditions must be fulfilled in order for the charge balance principle to be possible:

$$C\text{fb} > (C\text{meas} - C\text{off})$$

$$C\text{meas} > C\text{fb}.$$

The circuit operates at a non-overlapping two-phase clock of constant frequency. In the first clock phase, the switches 112, 118 and 152 are closed and the capacitances 104, 108 and 150 are charged. In the second clock phase, the switches 115, 122 and 154 are closed and the charges of all three capacitances are transferred onto the integration capacitance 106.

A static portion of the capacitance 104 to be measured can be suppressed by the embodiment of the present invention shown in FIG. 3, wherein advantageously the quantity of the offset capacitance 150 is to be selected such that it corresponds to the static portion of the measuring capacitance 104.

Figure 4:
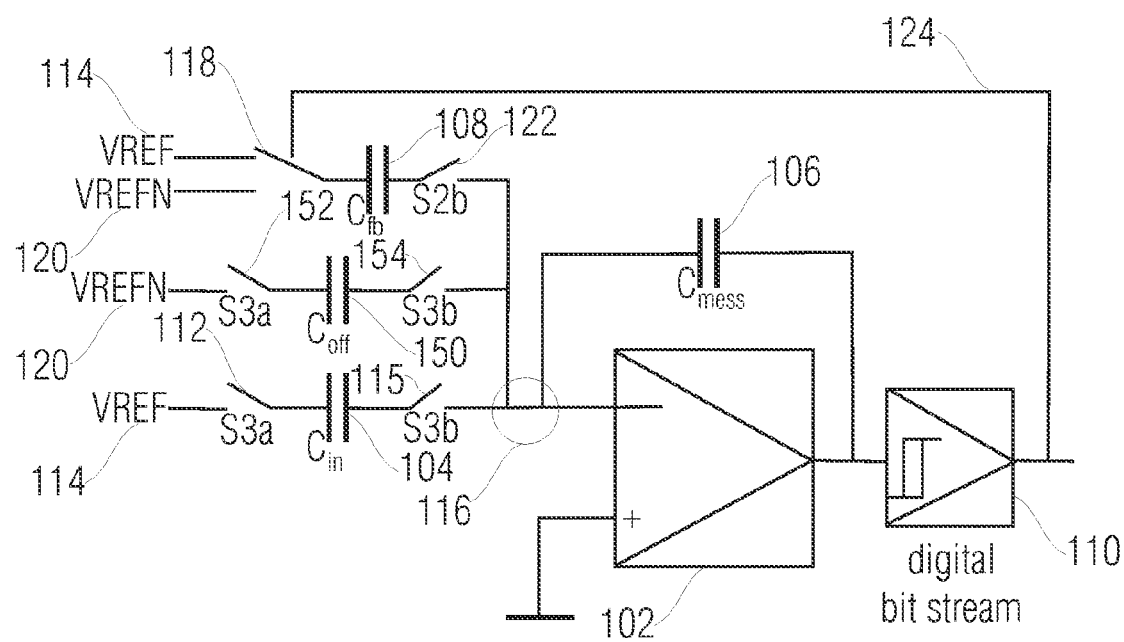
FIG. 4 shows a capacitance measuring circuit including a capacitance to be measured in the feedback branch.

FIG. 4 shows an alternative embodiment of the inventive capacitance measuring circuit of FIG. 3 which differs from FIG. 3 in that the capacitance to be measured is the capacitance 106 in the feedback branch of the operational amplifier 102. Since otherwise the mode of functioning is identical to the mode of functioning described referring to FIG. 3, reference is made to the explanations of FIG. 3 for a detailed description.

Figure 5:
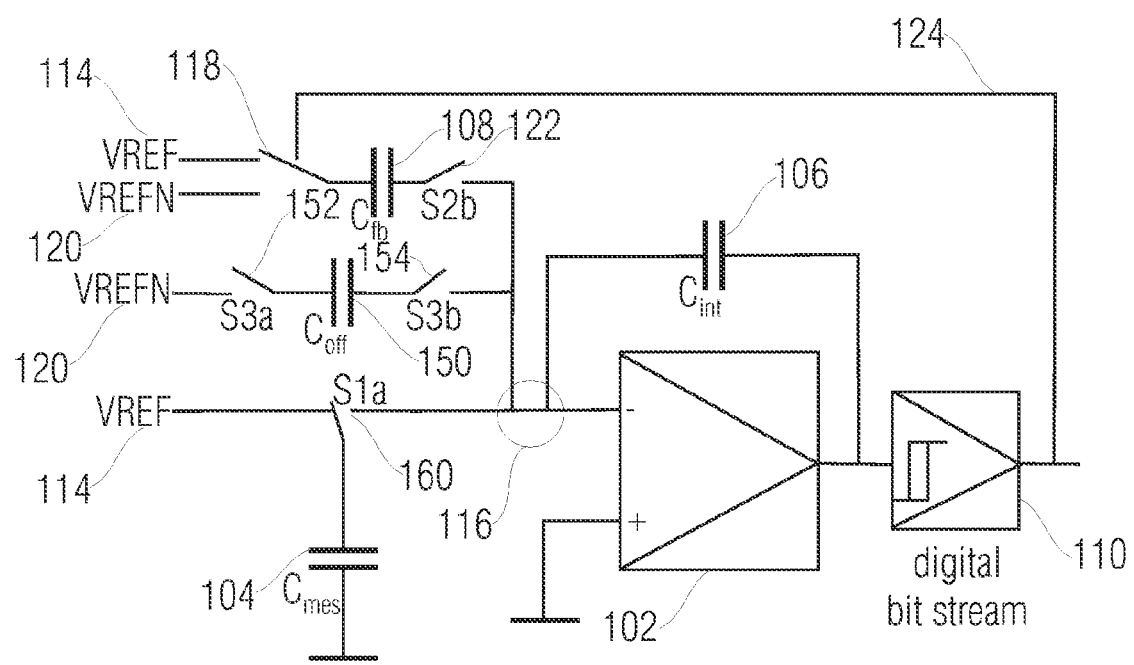
FIG. 5 shows a capacitance measuring circuit having a capacitance to be measured in the input branch.

FIG. 5 shows another embodiment of the present capacitance measuring circuit, wherein the measuring capacitance 104 to be determined is disposed in an alternative switching variation in the input branch of the operational amplifier 102. The measuring capacitance 104 is grounded with a first terminal, wherein it can be connected with a second terminal to either the positive supply voltage 114 or the circuit node 116 via a switch 160. Driving takes place in a clocked manner and equivalently to the embodiments above, wherein the switch 160 is driven such that it connects the measuring capacitance to the positive supply voltage 114 at times when the switches 118 and 152 are closed. The switch 160 connects the measuring capacitance 104 to the circuit node 116 at times when the switches 122 and 154 are closed.

With the otherwise equivalent mode of functioning, it is possible by means of the embodiment shown here to spare one switch, because the switch 160 is operated as a changeover switch.

Figure 6:
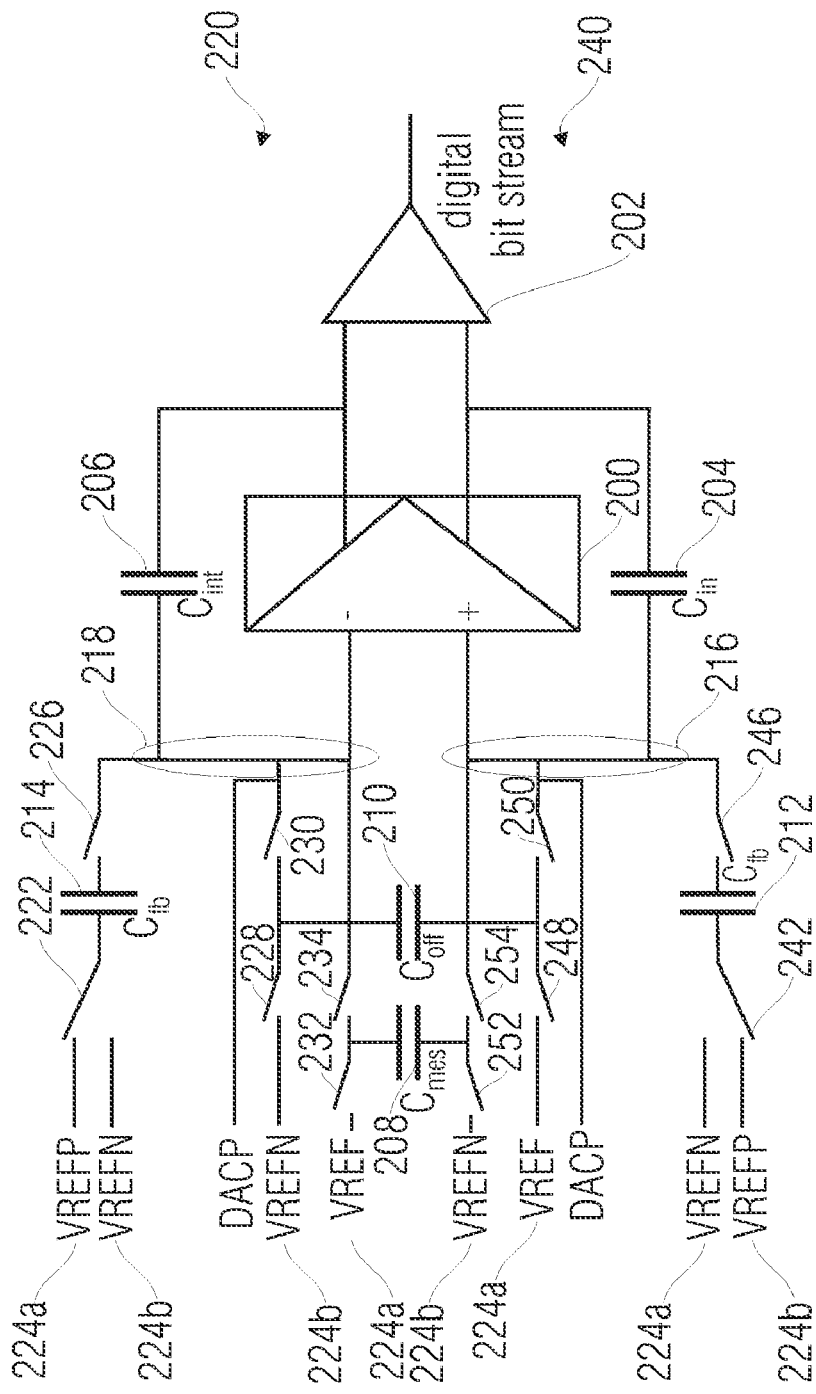
FIG. 6 shows a capacitance measuring circuit in differential structure.

FIG. 6 shows an inventive capacitance measuring circuit based on a delta-sigma modulator in a differential structure comprising a differential operational amplifier 200, signal processing means 202, a first integration capacitance 204, a second integration capacitance 206, a measuring capacitance 208, an offset capacitance 210 and a first balance capacitance 212 and a second balance capacitance 214. The first feedback capacitance 204 is connected between the non-inverting output of the differential operational amplifier and a first circuit node 216 and the second feedback capacitance 206 is connected between the inverting output of the differential operational amplifier 200 and a second circuit node 218.

The first circuit node 216 is connected to the non-inverting input of the differential operational amplifier 200 and the second circuit node 218 is connected to the inverting input of the differential operational amplifier 200. In an inverting branch 220 of the inventive capacitance measuring circuit in a differential structure, a first terminal of the second balance capacitance 214 is connectable to either a positive supply voltage 224a or a negative supply voltage 224b via a switch 222. A second terminal of the second balance capacitance is connectable to the second circuit node 218 via a switch 226. A first terminal of the offset capacitance 210 is connectable to the negative reference voltage 224b via a switch 228 and to the second voltage node 218 via a switch 230. The measuring capacitance 208 is, with a first terminal, connectable to the positive supply voltage 224a via a switch 232 and to the second circuit node 218 via a switch 234.

In a non-inverting branch 240 of the inventive capacitance measuring circuit, the first balance capacitance 212 is connectable to either the negative reference voltage 224b or the positive reference voltage 224a via a switch 242. A second terminal of the first balance capacitance 212 is connectable to the first circuit node 216 via a switch 246. A second terminal of the offset capacitance 210 is connectable to the positive reference voltage 224 via a switch 248 and to the first circuit node 216 via a switch 250. The measuring capacitance 208 is connectable, with a second terminal, to the negative reference voltage 224b via a switch 252 and to the first circuit node 216 via a switch 254.

As can be seen in FIG. 6, the differential operational amplifier 200 has a fully balanced wiring, which means that, with otherwise identical device layout, the positive reference voltage terminals are exchanged with the negative reference voltage terminals when transiting from the non-inverting part 240 to the inverting part 220. Driving the capacitance measuring circuit in a differential structure, as is shown in FIG. 6, takes place equivalently to the non-differential structures of a non-overlapping two-phase clock, as is, for example, shown in FIG. 2b. Thus, the switches 222, 228, 232, 252, 248 and 242 are driven by a first clock signal (exemplarily signal 140 in FIG. 2b) and the switches 226, 230, 234, 254, 250 and 246 are driven by a second clock signal which does not overlap the first clock signal (exemplarily clock signal 142 in FIG. 2b).

The signal processing means 202 adds the integrated signals applied to the inverting and non-inverting outputs of the differential operational amplifier 200 and, in analogy to the non-differential delta-sigma modulator, generates a digital bit stream as an output signal by means of which the switching performance of the switches 222 and 242 is also controlled.

The great advantage of the differential implementation shown here is that interferences impressed on the circuit by, for example, inductive effects, are largely compensated by the differential structure so that the measuring results are not corrupted. This is of particular advantage in surroundings prone to interferences, like for example vehicles.

Although the inventive capacitance measuring circuit has primarily been discussed before in connection with measuring capacitances for realizing protection against trapping for electric window lifts of automobiles, the capacitance measuring circuit is of course applicable to different fields where a reliable and quick detection of a capacitance is desirable.

Although in the embodiments discussed referring to FIGS. 1 to 6 the capacitances to be measured have been precharged by means of a voltage to subsequently accumulate the charge on an integration capacitance, charging onto the capacitance to be measured must not necessarily take place by connecting the capacitance to be measured to a reference voltage source. Any other implementations ensuring that a test charge of a certain quantity is transferred to the capacitance to be measured is also suitable for putting the inventive concept for measuring a capacitance into practice.

The inventive capacitance measuring circuit allows measuring a capacitance which is disposed either in a feedback branch of an operational amplifier or in a feed branch of the operational amplifier, wherein the capacitance to be measured is disposed in the feed branch of the operational amplifier. Thus, the capacitance measuring circuit is of advantage in particular in a differential form to achieve higher security against interferences.

Although in the clock signals for driving the switches of the inventive capacitance measuring circuit, as can be seen in FIG. 2b, the clock frequencies 140 and 142 have different clock relations (phases 144 and 148), this is not necessary for the mode of functioning of the inventive capacitance measuring circuit. The times may be in any relation to one another, i.e. in particular may also have an equal length. The only thing essential is that the two clocks do not overlap in time.

Although in the embodiments discussed before the inventive capacitance measuring circuit is operated by only two reference voltages, it is possible in principle to use a greater number of reference voltages, wherein for reasons of simplicity of the implementation, using only two reference voltages of identical magnitudes but different signs is of advantage.

In the capacitance measuring circuit in differential implementation, as is shown in FIG. 6, the capacitances 212 and 214 and/or the capacitances 204 and 206 are each equal in pairs. This, however, is not absolutely necessary but of advantage for an easy implementation. If the capacitances mentioned are not equal in pairs, the inequality of the capacitances must be taken into consideration in digital signal processing.

In principle, the requirements discussed when explaining FIG. 3 are made to the quantity of the capacitances used in an inventive capacitance measuring circuit. A suitable implementation here is, for example, one where the capacitance to be measured is roughly double the size of the balance capacitance.

In the embodiments illustrating a capacitance measuring circuit including a way for offset correction, the offset capacitance in the circuit is illustrated as a discrete device. In a real implementation of a circuit, the offset capacitance may, for example, be an integrated silicon capacitance, an external offset capacitance or be realized by an integrated capacitance DAC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A capacitance measuring circuit operated in a clocked manner, comprising:
    a delta-sigma modulator in differential structure comprising an operational amplifier comprising differential outputs, and a first variable capacitor connected in a first clock with a first terminal to the inverting input and with a second terminal to the non-inverting input of the operational amplifier; and
    a first reference signal source connected in a second clock to the first terminal of the first variable capacitor and a second reference signal source connected in the second clock to the second terminal of the first variable capacitor; wherein
    the first variable capacitor represents a capacitance to be measured; and
    a signal processing device is coupled to the differential outputs of the operational amplifier and is arranged to generate a digital bit stream.

2. The capacitance measuring circuit according to claim 1, wherein the first reference signal source is implemented to provide a reference voltage, and wherein the second reference signal source is implemented to provide a reference voltage comprising the same magnitude as the first reference signal source but a different sign.

3. The capacitance measuring circuit according to claim 1, wherein the capacitance measuring circuit additionally comprises an offset signal source connectable to the inverting and the non-inverting input of the operational amplifier to provide a constant offset capacitance to compensate for a static portion of the capacitance of the first variable capacitor.

4. The capacitance measuring circuit according to claim 3, wherein the offset signal source comprises a second capacitor connected in the first clock with a first terminal to the inverting input and with a second terminal to the non-inverting input of the operational amplifier; wherein
    the second capacitor is connected in the second clock with the first terminal to the second reference signal source and with the second terminal to the first reference signal source.

5. The capacitance measuring circuit according to claim 1, wherein a first balance signal source is connectable to the inverting input and a second balance signal source to the non-inverting input of the operational amplifier for providing a positive and a negative balance signal.

6. The capacitance measuring circuit according to claim 5, wherein the first and second balance signal sources each comprise another capacitor connected to the first reference signal source or to the second reference signal source by a respective switch, wherein the switches are controlled by the digital bit stream output from the signal processing device.

* * * * *